United States Patent
Lee et al.

(10) Patent No.: US 7,138,707 B1
(45) Date of Patent: Nov. 21, 2006

(54) SEMICONDUCTOR PACKAGE INCLUDING LEADS AND CONDUCTIVE POSTS FOR PROVIDING INCREASED FUNCTIONALITY

(75) Inventors: Seung Ju Lee, Namyangju-shi (KR); Won Chul Do, Kwanggin-gu (KR); Kwang Eung Lee, Kwanggin-gu (KR)

(73) Assignee: Amkor Technology, Inc., Chandler, AZ (US)

( * ) Notice: Subject to any disclaimer, the term of this patent is extended or adjusted under 35 U.S.C. 154(b) by 129 days.

(21) Appl. No.: 10/690,193

(22) Filed: Oct. 21, 2003

(51) Int. Cl.
H01L 23/48 (2006.01)
H01L 23/28 (2006.01)
H01L 31/072 (2006.01)
H01L 23/31 (2006.01)
H01L 23/495 (2006.01)

(52) U.S. Cl. .............. 257/684; 257/E23.033; 257/E23.042; 257/E23.124; 257/E23.039; 257/E23.052; 257/E23.043; 257/E23.054; 257/E23.047; 257/E23.092; 257/E23.046; 257/796; 257/666; 257/698; 257/696; 257/737; 257/738; 257/675; 257/712

(58) Field of Classification Search .............. 257/684, 257/796, 666, 696, 698, 675, 676, 778, 737, 257/734, 738, 787, 788, 712, E23.033, E23.042, 257/E23.124, E23.039, E23.052, E23.092
See application file for complete search history.

(56) References Cited

U.S. PATENT DOCUMENTS

| | | | |
|---|---|---|---|
| 2,596,993 A | 5/1952 | Gookin | |
| 3,435,815 A | 4/1969 | Forcier | |
| 3,734,660 A | 5/1973 | Davies et al. | |
| 3,838,984 A | 10/1974 | Crane et al. | |
| 4,054,238 A | 10/1977 | Lloyd et al. | |
| 4,189,342 A | 2/1980 | Kock | |
| 4,258,381 A | 3/1981 | Inaba | |
| 4,289,922 A | 9/1981 | Devlin | |
| 4,301,464 A | 11/1981 | Otsuki et al. | |
| 4,332,537 A | 6/1982 | Slepcevic | |
| 4,417,266 A | 11/1983 | Grabbe | |
| 4,451,224 A | 5/1984 | Harding | |
| 4,530,152 A | 7/1985 | Roche et al. | |
| 4,541,003 A | 9/1985 | Otsuka et al. | |
| 4,646,710 A | 3/1987 | Schmid et al. | |
| 4,707,724 A | 11/1987 | Suzuki et al. | |
| 4,727,633 A | 3/1988 | Herrick | |
| 4,737,839 A | 4/1988 | Burt | |
| 4,756,080 A | 7/1988 | Thorp, Jr. et al. | |

(Continued)

FOREIGN PATENT DOCUMENTS

DE 19734794 A1 8/1997

(Continued)

Primary Examiner—Alexander Oscar Williams
(74) Attorney, Agent, or Firm—Stetina Brunda Garred & Brucker

(57) ABSTRACT

A semiconductor package comprising a semiconductor die which has opposed first and second surfaces and at least first and second bond pads disposed on the second surface thereof. In addition to the semiconductor die, the semiconductor package includes at least one lead having opposed first and second surfaces, the first surface of the lead being electrically connected to the first bond pad. Also included in the semiconductor package is at least one conductive post having opposed first and second surfaces, the first surface of the conductive post being electrically connected to the second bond pad. A package body at least partially encapsulates the semiconductor die, the lead, and the conductive post such that the second surface of the lead and the second surface of the conductive post are exposed in a common exterior surface of the package body.

20 Claims, 15 Drawing Sheets

U.S. PATENT DOCUMENTS

| | | |
|---|---|---|
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga et al. |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,302,849 A * | 4/1994 | Cavasin ............... 257/666 |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasaranthi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,909,053 A | 6/1999 | Fukase et al. |
| 5,915,998 A | 6/1999 | Stidham et al. |
| 5,917,242 A | 6/1999 | Ball |
| 5,939,779 A | 8/1999 | Kim |
| 5,942,794 A | 8/1999 | Okumura et al. |
| 5,942,795 A * | 8/1999 | Hoang ............... 257/692 |
| 5,951,305 A | 9/1999 | Haba |
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |

| | | | |
|---|---|---|---|
| 5,977,613 A | 11/1999 | Takata et al. | |
| 5,977,615 A | 11/1999 | Yamaguchi et al. | |
| 5,977,630 A | 11/1999 | Woodworth et al. | |
| 5,981,314 A | 11/1999 | Glenn et al. | |
| 5,986,333 A | 11/1999 | Nakamura | |
| 5,986,885 A | 11/1999 | Wyland | |
| 6,001,671 A | 12/1999 | Fjelstad | |
| 6,013,947 A | 1/2000 | Lim | |
| 6,018,189 A | 1/2000 | Mizuno | |
| 6,020,625 A | 2/2000 | Qin et al. | |
| 6,025,640 A | 2/2000 | Yagi et al. | |
| 6,031,279 A | 2/2000 | Lenz | |
| RE36,613 E | 3/2000 | Ball | |
| 6,034,423 A | 3/2000 | Mostafazadeh | |
| 6,040,626 A | 3/2000 | Cheah et al. | |
| 6,043,430 A | 3/2000 | Chun | |
| 6,060,768 A | 5/2000 | Hayashida et al. | |
| 6,060,769 A | 5/2000 | Wark | |
| 6,072,228 A | 6/2000 | Hinkle et al. | |
| 6,075,284 A | 6/2000 | Choi et al. | |
| 6,081,029 A | 6/2000 | Yamaguchi | |
| 6,084,291 A * | 7/2000 | Fujimori | 257/668 |
| 6,084,310 A | 7/2000 | Mizuno et al. | |
| 6,087,715 A | 7/2000 | Sawada et al. | |
| 6,087,722 A | 7/2000 | Lee et al. | |
| 6,100,594 A | 8/2000 | Fukui et al. | |
| 6,113,474 A | 9/2000 | Constantini et al. | |
| 6,118,174 A | 9/2000 | Kim | |
| 6,118,184 A | 9/2000 | Ishio et al. | |
| RE36,907 E | 10/2000 | Templeton, Jr. et al. | |
| 6,130,115 A | 10/2000 | Okumura et al. | |
| 6,130,473 A | 10/2000 | Mostafazadeh et al. | |
| 6,133,623 A | 10/2000 | Otsuki et al. | |
| 6,140,154 A | 10/2000 | Hinkle et al. | |
| 6,143,981 A | 11/2000 | Glenn | |
| 6,169,329 B1 | 1/2001 | Farnworth et al. | |
| 6,177,718 B1 | 1/2001 | Kozono | |
| 6,181,002 B1 | 1/2001 | Juso et al. | |
| 6,184,465 B1 | 2/2001 | Corisis | |
| 6,184,573 B1 | 2/2001 | Pu | |
| 6,194,777 B1 | 2/2001 | Abbott et al. | |
| 6,197,615 B1 | 3/2001 | Song et al. | |
| 6,198,171 B1 | 3/2001 | Huang et al. | |
| 6,201,186 B1 | 3/2001 | Daniels et al. | |
| 6,201,292 B1 | 3/2001 | Yagi et al. | |
| 6,204,554 B1 | 3/2001 | Ewer et al. | |
| 6,208,020 B1 | 3/2001 | Minamio et al. | |
| 6,208,021 B1 | 3/2001 | Ohuchi et al. | |
| 6,208,023 B1 | 3/2001 | Nakayama et al. | |
| 6,211,462 B1 | 4/2001 | Carter, Jr. et al. | |
| 6,218,731 B1 | 4/2001 | Huang et al. | |
| 6,222,258 B1 | 4/2001 | Asano et al. | |
| 6,225,146 B1 | 5/2001 | Yamaguchi et al. | |
| 6,229,200 B1 | 5/2001 | McLellan et al. | |
| 6,229,205 B1 | 5/2001 | Jeong et al. | |
| 6,239,367 B1 | 5/2001 | Hsuan et al. | |
| 6,239,384 B1 | 5/2001 | Smith et al. | |
| 6,242,281 B1 | 6/2001 | McLellan et al. | |
| 6,256,200 B1 | 7/2001 | Lam et al. | |
| 6,258,629 B1 | 7/2001 | Niones et al. | |
| 6,281,566 B1 | 8/2001 | Magni | |
| 6,281,568 B1 | 8/2001 | Glenn et al. | |
| 6,282,095 B1 | 8/2001 | Houghton et al. | |
| 6,285,075 B1 | 9/2001 | Combs et al. | |
| 6,291,271 B1 | 9/2001 | Lee et al. | |
| 6,291,273 B1 | 9/2001 | Miyaki et al. | |
| 6,294,100 B1 | 9/2001 | Fan et al. | |
| 6,294,830 B1 | 9/2001 | Fjelstad | |
| 6,295,977 B1 | 10/2001 | Ripper et al. | |
| 6,297,548 B1 | 10/2001 | Moden et al. | |
| 6,300,686 B1 * | 10/2001 | Hirano et al. | 257/783 |
| 6,303,984 B1 | 10/2001 | Corisis | |
| 6,303,997 B1 | 10/2001 | Lee | |
| 6,307,272 B1 | 10/2001 | Takahashi et al. | |
| 6,309,909 B1 | 10/2001 | Ohgiyama | |
| 6,316,822 B1 | 11/2001 | Venkateshwaran et al. | |
| 6,316,838 B1 | 11/2001 | Ozawa et al. | |
| 6,323,550 B1 * | 11/2001 | Martin et al. | 257/704 |
| 6,326,243 B1 | 12/2001 | Suzuya et al. | |
| 6,326,244 B1 | 12/2001 | Brooks et al. | |
| 6,326,678 B1 | 12/2001 | Karmezos et al. | |
| 6,335,564 B1 | 1/2002 | Pour | |
| 6,337,510 B1 | 1/2002 | Chun-Jen et al. | |
| 6,339,255 B1 | 1/2002 | Shin | |
| 6,348,726 B1 | 2/2002 | Bayan et al. | |
| 6,355,502 B1 | 3/2002 | Kang et al. | |
| 6,369,447 B1 | 4/2002 | Mori | |
| 6,369,454 B1 | 4/2002 | Chung | |
| 6,373,125 B1 * | 4/2002 | Pannaccione et al. | 257/666 |
| 6,373,127 B1 | 4/2002 | Baudouin et al. | |
| 6,380,048 B1 | 4/2002 | Boon et al. | |
| 6,384,472 B1 | 5/2002 | Huang | |
| 6,388,336 B1 | 5/2002 | Venkateshwaran et al. | |
| 6,395,578 B1 | 5/2002 | Shin et al. | |
| 6,400,004 B1 | 6/2002 | Fan et al. | |
| 6,410,979 B1 | 6/2002 | Abe | |
| 6,414,385 B1 | 7/2002 | Huang et al. | |
| 6,420,779 B1 | 7/2002 | Sharma et al. | |
| 6,429,508 B1 | 8/2002 | Gang | |
| 6,437,429 B1 | 8/2002 | Su et al. | |
| 6,444,499 B1 | 9/2002 | Swiss et al. | |
| 6,448,633 B1 | 9/2002 | Yee et al. | |
| 6,452,279 B1 | 9/2002 | Shimoda | |
| 6,464,121 B1 | 10/2002 | Reijnders | |
| 6,476,469 B1 | 11/2002 | Hung et al. | |
| 6,476,474 B1 | 11/2002 | Hung | |
| 6,482,680 B1 | 11/2002 | Khor et al. | |
| 6,498,099 B1 | 12/2002 | McLellan et al. | |
| 6,498,392 B1 * | 12/2002 | Azuma | 257/676 |
| 6,507,096 B1 | 1/2003 | Gang | |
| 6,507,120 B1 | 1/2003 | Lo et al. | |
| 6,534,849 B1 | 3/2003 | Gang | |
| 6,545,345 B1 | 4/2003 | Glenn et al. | |
| 6,559,525 B1 * | 5/2003 | Huang | 257/675 |
| 6,566,168 B1 | 5/2003 | Gang | |
| 6,590,281 B1 * | 7/2003 | Wu et al. | 257/684 |
| 6,597,059 B1 * | 7/2003 | McCann et al. | 257/673 |
| 6,597,070 B1 * | 7/2003 | Miyazaki | 257/778 |
| 6,661,087 B1 * | 12/2003 | Wu | 257/692 |
| 6,667,543 B1 * | 12/2003 | Chow et al. | 257/676 |
| 6,743,661 B1 * | 6/2004 | Drewery | 438/110 |
| 6,815,833 B1 * | 11/2004 | Lee et al. | 257/778 |
| 6,828,229 B1 * | 12/2004 | Lee et al. | 438/638 |
| 6,846,704 B1 * | 1/2005 | Paek | 438/123 |
| 6,858,919 B1 * | 2/2005 | Seo et al. | 257/666 |
| 6,867,072 B1 * | 3/2005 | Shiu et al. | 438/123 |
| 6,873,032 B1 * | 3/2005 | McCann et al. | 257/673 |
| 6,876,087 B1 * | 4/2005 | Ho et al. | 257/778 |
| 6,894,904 B1 * | 5/2005 | Kung et al. | 361/774 |
| 6,953,988 B1 * | 10/2005 | Seo et al. | 257/666 |
| 7,045,883 B1 * | 5/2006 | McCann et al. | 257/673 |
| 2001/0008305 A1 | 7/2001 | McLellan et al. | |
| 2001/0014538 A1 | 8/2001 | Kwan et al. | |
| 2002/0011654 A1 | 1/2002 | Kimura | |
| 2002/0020907 A1 * | 2/2002 | Seo et al. | 257/687 |
| 2002/0024122 A1 | 2/2002 | Jung et al. | |
| 2002/0027297 A1 | 3/2002 | Ikenaga et al. | |
| 2002/0140061 A1 | 10/2002 | Lee | |
| 2002/0140068 A1 | 10/2002 | Lee et al. | |
| 2002/0163015 A1 | 11/2002 | Lee et al. | |
| 2003/0001252 A1 * | 1/2003 | Ku et al. | 257/686 |
| 2003/0030131 A1 | 2/2003 | Lee et al. | |
| 2003/0073265 A1 | 4/2003 | Hu et al. | |
| 2004/0106229 A1 * | 6/2004 | Jiang et al. | 438/106 |

| | | | | | | |
|---|---|---|---|---|---|---|
| 2005/0151238 A1* | 7/2005 | Yamunan ............... 257/696 | JP | 6140563 | 5/1994 | |
| | | | JP | 6260532 | 9/1994 | |
| | FOREIGN PATENT DOCUMENTS | | JP | 7297344 | 11/1995 | |
| | | | JP | 7312405 | 11/1995 | |
| EP | 5421117 | 6/1979 | JP | 864634 | 3/1996 | |
| EP | 5950939 | 3/1984 | JP | 8083877 | 3/1996 | |
| EP | 0393997 | 10/1990 | JP | 8125066 | 5/1996 | |
| EP | 0459493 | 12/1991 | JP | 8222682 | 8/1996 | |
| EP | 0720225 | 3/1996 | JP | 8306853 | 11/1996 | |
| EP | 0720234 | 3/1996 | JP | 98205 | 1/1997 | |
| EP | 0794572 A2 | 10/1997 | JP | 98206 | 1/1997 | |
| EP | 0844665 | 5/1998 | JP | 98207 | 1/1997 | |
| EP | 0936671 | 8/1999 | JP | 992775 | 4/1997 | |
| EP | 098968 | 3/2000 | JP | 9293822 | 11/1997 | |
| EP | 1032037 | 8/2000 | JP | 10022447 | 1/1998 | |
| JP | 55163868 | 12/1980 | JP | 10163401 | 6/1998 | |
| JP | 5745959 | 3/1982 | JP | 10199934 | 7/1998 | |
| JP | 58160095 | 8/1983 | JP | 10256240 | 9/1998 | |
| JP | 59208756 | 11/1984 | JP | 00150765 | 5/2000 | |
| JP | 59227143 | 12/1984 | JP | 556398 | 10/2000 | |
| JP | 63316470 | 12/1988 | JP | 2001060648 | 3/2001 | |
| JP | 64054749 | 3/1989 | JP | 200204397 | 8/2002 | |
| JP | 1106456 | 4/1989 | KR | 941979 | 1/1994 | |
| JP | 1175250 | 7/1989 | KR | 9772358 | 11/1997 | |
| JP | 1205544 | 8/1989 | KR | 100220154 | 6/1999 | |
| JP | 1251747 | 10/1989 | KR | 0049944 | 6/2002 | |
| JP | 3177060 | 8/1991 | KR | 200086238 | 7/2002 | |
| JP | 4098864 | 9/1992 | WO | 9956316 | 11/1999 | |
| JP | 5129473 | 5/1993 | WO | 9967821 | 12/1999 | |
| JP | 5166992 | 7/1993 | | | | |
| JP | 5283460 | 10/1993 | * cited by examiner | | | |
| JP | 692076 | 4/1994 | | | | |

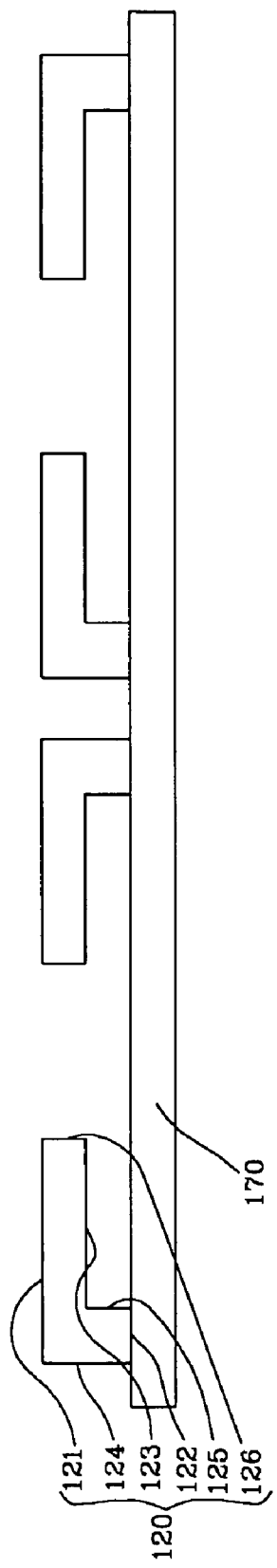

SEMICONDUCTOR PACKAGE INCLUDING LEADS AND CONDUCTIVE POSTS FOR PROVIDING INCREASED FUNCTIONALITY

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to semiconductor packages, and more particularly to a semiconductor package including internal conductive posts for electrical interface to interior bond pads of a semiconductor die.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component.

In the electronics industry, hand held portable applications such as cell phones, PDA's (Personal Digital Assistants), Bluetooth, and IMT2000 require semiconductor packages which are progressively smaller and lighter, yet of increasing performance. In many of the above-described conventional semiconductor packages wherein portions of the leads are partially exposed within the package body, such leads are typically included along only the peripheral edge of the package body. To meet the requirements of current hand held portable applications, the semiconductor packages used therein must have higher electrical performance and functionality, and thus increased numbers of leads which are electrically connectable to an external device. Although it has been suggested in the prior art to narrow the pitch of the leads formed at the periphery of the bottom surface of the package body to increase the number of leads, there are physical limitations in narrowing the lead pitch during the manufacture of the leadframe. Also, excessive narrowing in the lead pitch gives rise to a susceptibility of solder shorting between the leads when the semiconductor package is connected to an external device through the use of solder.

The need for increased numbers of leads is driven, in large measure, by semiconductor dies of increased functionality which include bond pads at both the central region and the periphery of a common surface thereof. In current semiconductor package designs, it is extremely difficult to connect both these peripheral and central bond pads to each of the leads, due to the necessity of extending certain ones of the leads to the center of the semiconductor die to interface to the central bond pads, while avoiding any contact between these extended leads and the peripheral bond pads of the semiconductor die. The present invention addresses these problems by providing a semiconductor package which, in addition to including leads which are electrically interfaced to peripheral bond pads of a semiconductor die, further includes one or more conductive posts which are an electrically interfaced to the central bond pads of the semiconductor die. These and other features of the present invention will be discussed in more detail below.

BRIEF SUMMARY OF THE INVENTION

In accordance with the present invention, there is provided multiple embodiments of a semiconductor package, each of which comprises a multiplicity of leads arranged in a generally quadrangular pattern circumventing one or more elongate conductive posts. Electrically connected to both the leads and the conductive posts is a semiconductor die which includes both peripheral and central bond pads disposed on a common surface thereof. The semiconductor die, leads and conductive posts are sized and arranged relative to each other such that the peripheral bond pads of the semiconductor die may be placed in overlapping relation to portions of each of the leads, and electrically connected thereto through the use of conductive bumps. The central bond pads of the semiconductor die are themselves electrically connected to respective ones of the conductive posts either directly or through the use of conductive bumps. Portions of the leads and the conductive bumps are exposed in a common exterior surface of the package body for connection to an external device or component The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein:

FIGS. 4A–4F illustrate an exemplary sequence of steps which may be used to facilitate the fabrication of the semiconductor package of the first embodiment shown in FIGS. 1A–1D.

Common reference numerals are used throughout the drawings and detailed description to indicate like elements.

DETAILED DESCRIPTION OF THE INVENTION

Figure 1A:
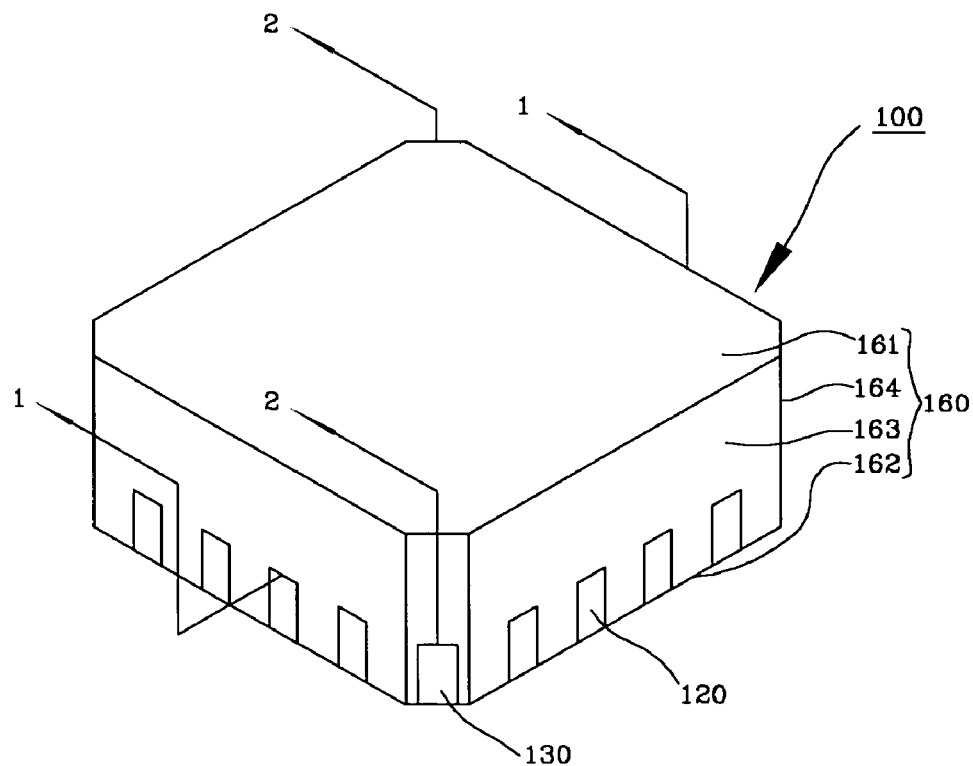
FIG. 1A is a top perspective view of a semiconductor package constructed in accordance with a first embodiment of the present invention.

Referring now to the drawings wherein the showings are for purposes of illustrating preferred embodiments of the present invention only, and not for purposes of limiting the same, FIGS. 1A–1D depict a semiconductor package 100 constructed in accordance with a first embodiment of the present invention. The semiconductor package 100 comprises a semiconductor die 110 which defines a generally planar first (top) surface 111 and an opposed, generally planar second (bottom) surface 112. Disposed on the second surface 112 of the semiconductor die 110 are first bond pads 113 and second bond pads 114. The first bond pads 113 are formed in spaced relation to each other along the periphery of the second surface 112 (i.e., in close proximity to the side surfaces or edges of the semiconductor die 110). The second bond pads 114 are formed in spaced relation to each other in the central portion or region of the second surface 112. As such, the first bond pads 113 are positioned outwardly relative to the second bond pads 114. It is contemplated that the peripheral first bond pads 113 will circumvent the central second bond pads 114.

In addition to the semiconductor die 110, the semiconductor package 100 comprises a plurality of leads 120. Each of the leads 120 defines a generally planar first (top) surface 121 and an opposed, generally planar second (bottom) surface 122 which extends in generally parallel relation to the first surface 121. In addition to the first and second surfaces 121, 122, each lead 120 defines a generally planar third surface 123 which is perpendicularly recessed relative to the second surface 122, and extends in opposed relation to the first surface 121. Thus, the third surface 123 is disposed between and substantially parallel to the first and second surfaces 121, 122.

Each lead 120 further defines a generally planar fourth surface 124 which extends substantially perpendicularly between the first and second surfaces 121, 122, and a generally planar fifth surface 125 which is disposed in opposed relation to the fourth surface 124 and extends substantially perpendicularly between the second and third surfaces 122, 123. Also included in each lead 120 is a generally planar sixth surface 126 which also extends in opposed relation to the fourth surface 124. The sixth surface 126 extends substantially perpendicularly between the first and third surfaces 121, 123 of the lead 120. As will be recognized, the sixth surface 126 defines the inner end of the lead 120, with the fourth surface 124 defining the outer end thereof. Each lead 120 is preferably fabricated from a metal material through either a mechanical stamping or chemical etching process. For example, each lead 120 may be made of copper, a copper alloy, copper plated steal, or an equivalent thereof. Those of ordinary skill in the art will recognize that the present invention is not limited to any particular material for each lead 120.

In addition to the leads 120, also included in the semiconductor package 100 are a plurality of dummy leads 130. Each dummy lead 130 defines a generally planar first (top) surface 131 and an opposed, generally planar second (bottom) surface 132. The first and second surfaces 131, 132 extend in spaced, generally parallel relation to each other. In addition to the first and second surfaces 131, 132, each dummy lead 130 includes a generally planar third surface 133 which is perpendicularly recessed relative to the second surface 132 and disposed in opposed relation to the first surface 131. As such, the third surface 133 of each dummy lead 130 is disposed between and substantially parallel to the first and second surfaces 131, 132 thereof.

Figure 1B:
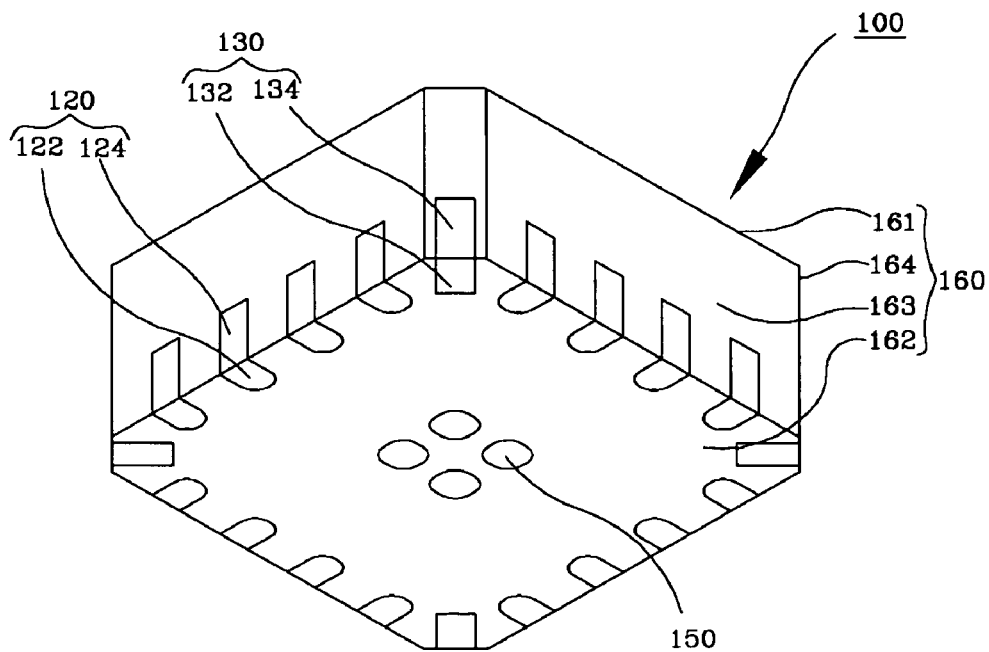
FIG. 1B is a bottom perspective view of the semiconductor package of the first embodiment shown in FIG. 1A.
Figure 1C:
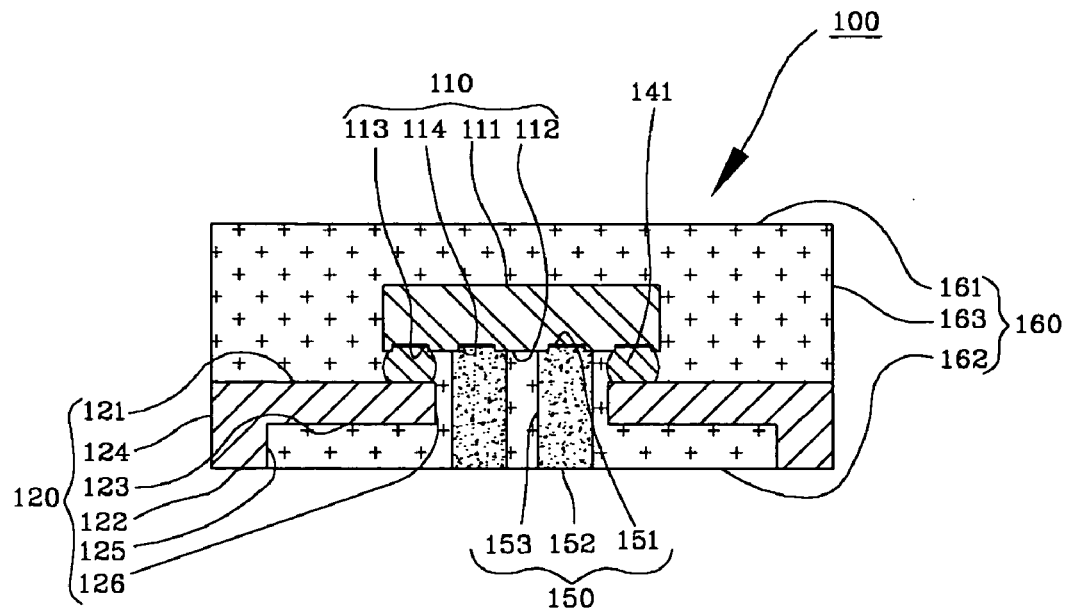
FIG. 1C is a cross-sectional view of the semiconductor package of the first embodiment taken along line 1—1 of FIG. 1A.
Figure 1D:
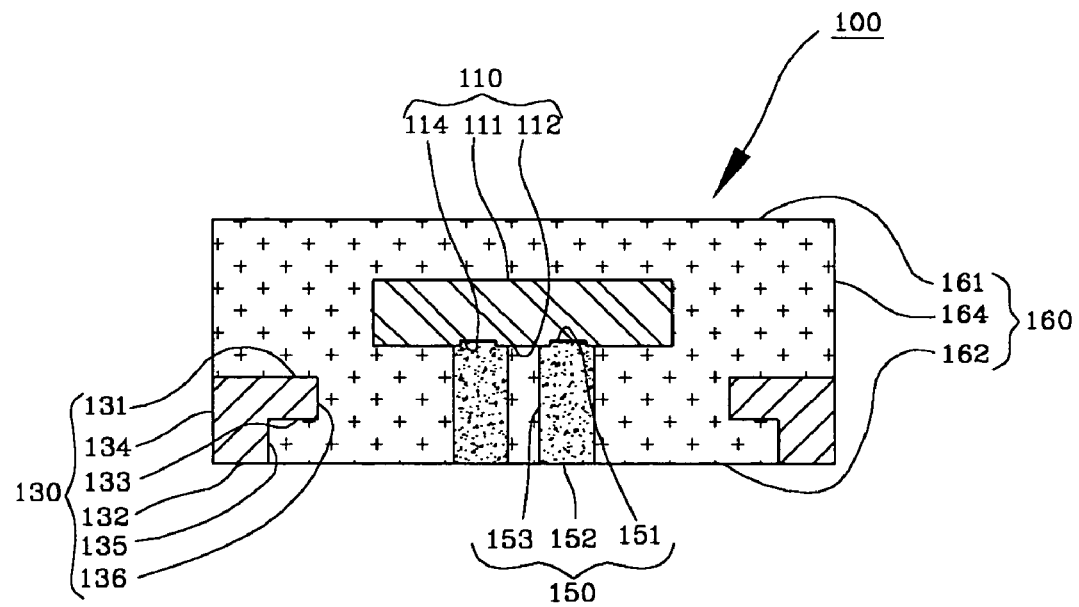
FIG. 1D is a cross-sectional view of the semiconductor package of the first embodiment taken along line 2—2 of FIG. 1A.

Each dummy lead 130 further defines a generally planar fourth surface 134 which extends substantially perpendicularly between the first and second surfaces 131, 132 and defines the outer end of the dummy lead 130. Additionally, extending substantially perpendicularly between the second and third surfaces 132, 133 is a generally planar fifth surface 135 which is disposed in opposed relation to the fourth surface 134. Also disposed in opposed relation to the fourth surface 134 is a sixth surface 136 which extends substantially perpendicularly between the first and third surfaces 131, 133 and defines the inner end of the dummy lead 130. Both the fifth surface 135 and sixth surface 136 extend in spaced, generally parallel relation to the fourth surface 134. As best seen in FIGS. 1C and 1D, the length of the first surface 121 of each lead 120 substantially exceeds the length of the first surface 131 of each dummy lead 130. Each dummy lead 130 may be made of the same material as each of the leads 120.

In the semiconductor package 100, the leads 120 and dummy leads 130 are preferably arranged in a substantially quadrangular pattern, with the dummy leads 130 being disposed at respective ones of the corners of the pattern. Thus, four dummy leads 130 are preferably included in the semiconductor package 100. The leads 120 are themselves preferably segregated into four sets, with the leads 120 of each set extending between a respective pair of the dummy leads 130. The leads 120 and dummy leads 130 are further preferably arranged such that the first surfaces 121, 131 extend in generally co-planar relation to each other, with the second surfaces 122, 132 also extending in generally co-planar relation to each other. Additionally, the fourth surfaces 124 of the leads 120 of each of the four sets thereof preferably extend in generally co-planar relation to each other.

As seen in FIGS. 1C and 1D, the semiconductor die 110 and leads 120 are sized and arranged relative to each other such that the peripheral portion of the second surface 112 of the semiconductor die 110 overlaps inner portions of the first surfaces 121 of the leads 120. In this regard, as is best seen in FIG. 1C, the peripheral first bond pads 113 are electrically connected to the first surfaces 121 of respective ones of the leads 120 through the use of conductive bumps 141. More particularly, each conductive bump 141 is located between one of the first bond pads 113 of the semiconductor die 110 and the first surface 121 of one of the leads 120, and functions to facilitate the electrical connection between the first bond pad 113 and the first surface 121. An electrical signal from the semiconductor die 110 is transferred to an external device through the first bond pad 113, and the first and second surfaces 121, 122 of the corresponding lead 120. Each conductive bump 141 may be formed by screen-printing a conductive material to the corresponding first bond pad 113 of the semiconductor die 110, by plating a conductive material in a predetermined thickness on the corresponding first bond pad 113, or by dropping and reflowing a preformed conductive ball on the corresponding first bond pad 113. For example, the conductive bump 141 may be fabricated from Au, Ag, Sn/Pb (solder) or an equivalent thereof. However, those of ordinary skill in the art will recognize that the present invention is not limited to any particular material for the conductive bumps 141.

The semiconductor package 100 of the first embodiment further includes a plurality of elongate, generally cylindrical conductive posts 150. Each conductive post 150 defines a first (top) surface 151 and an opposed, generally planar second (bottom) surface 152. Each conductive post 150 further defines a third surface 152 which is preferably cylindrically configured, and extends substantially perpendicularly between the first and second surfaces 151, 152 thereof.

In the semiconductor package 100, the first surface 151 of each conductive post 150 is electrically connected to a respective one of the central second bond pads 114. Additionally, the conductive posts 150 are sized and arranged such that the second surfaces 152 thereof extend in generally co-planar relation to the second surfaces 122 of the leads 120 and the second surfaces 132 of the dummy leads 130. The third surfaces 153 of the conductive posts 150 are substantially parallel to the sixth surfaces 126 of the leads 120, and spaced from the sixth surfaces 126 at a distance which is sufficient to prevent any contact between the conductive posts 150 and the leads 120. Both the second surfaces 152 of the conductive posts 150 and the second surfaces 122 of the leads 120 can be connected to an external device. The conductive posts 150 are each preferably fabricated from a conductive material such as Cu, Al, Ni, Au, Ag, Sn/Pb (solder) or an equivalent thereof. However, those of ordinary skill in the art will recognize that the present invention is not limited to any particular material for each of the conductive posts 150. The conductive posts 150 can be formed by electrolytic plating or electroless plating with Cu, Al, Ni, Au, Ag, Sn/Pb (solder) or an equivalent thereof. As seen in FIGS. 1C and 1D, the length of each conductive post 150 (i.e., the distance between the first and second surfaces 151, 152, thereof) exceeds the distance separating the first and second surfaces 121, 122 of each lead 120 from each other. In this regard, the length of each conductive post 150 is substantially equal to the distance between the second surface 112 of the semiconductor die 110 and the second surfaces 122 of the leads 120 and second surfaces 132 of the dummy leads 130. An electrical signal from the semiconductor die 110 is transferred to an external device through each second bond pad 114, and the first and second surfaces 151, 152 of the corresponding conductive post 150. Thus, electrical signals from the semiconductor die 110 can be transferred to an external device through the conductive posts 150, as well as the leads 120.

The semiconductor package 100 of the first embodiment further comprises encapsulant material (e.g., a thermoset or thermoplastic) which, upon hardening, forms a package body 160 which completely encapsulates the semiconductor die 110 and conductive bumps 141, and partially encapsulates the leads 120, dummy leads 130, and conductive posts 150. The package body 160 defines a generally planar first (top) surface 161 and an opposed, generally planar second (bottom) surface 162 which extends in spaced, generally parallel relation to the first surface 161. In addition to the first and second surfaces 161, 162, the package body 160 defines four generally planar third surfaces 163 which extend substantially perpendicularly between the first and second surfaces 161, 162. Also defined by the package body 160 are four generally planar fourth surfaces 164 which are included as chamfers at respective ones of the four corners defined by the package body 160. The fourth surfaces 164 also each extend substantially perpendicularly between the first and second surfaces 161, 162, and further extend between each adjacent pair of the third surfaces 163.

In the semiconductor package 100, the second surfaces 122 of the leads 120 are exposed in and substantially flush with the second surface 162 of the package body 160. Additionally, the fourth surfaces 124 of the leads 120 are exposed in and substantially flush with respective ones of the third surfaces 163 of the package body 160. More particularly, the fourth surfaces 124 of the leads 120 of each set are exposed in and substantially flush with a common third surface 163 of the package body 160. The first, third, fifth and sixth surfaces 121, 123, 125 and 126 of each lead 120 are covered by the package body 160. The covering of the third surface 123 of each lead 120 with the package body 160 enhances the adhesion between the leads 120 and the package body 160, thereby preventing the separation of the leads 120 from the package body 160. Heat generated during the operation of the semiconductor die 110 can be effectively discharged out through the second and fourth surfaces 124, 122 of each lead 120 which, as indicated above, are exposed in the package body 160.

The second surfaces 132 of the dummy pads 130 are also exposed in and substantially flush with the second surface 162 of the package body 160. The fourth surfaces 134 of the dummy leads 130 are exposed in and substantially flush with respective ones of the fourth surfaces 164 of the package body 160. The first, third, fifth and sixth surfaces 131, 133, 135 and 136 of each dummy lead 130 are covered by the package body 160. The covering of the third surface 133 of each dummy lead 130 by the package body 160 assists in preventing inadvertent separation of the dummy leads 130 from the package body 160. In the semiconductor package 100, the dummy leads 130 are not electrically connected to the semiconductor die 110. However, the inclusion of the dummy leads 130 at each of the four corner regions of the package body 160 assists in preventing chip-out of the corner regions which typically have inferior rigidity.

In the semiconductor package 100, the second surfaces 152 of the conductive posts 150 are also exposed in and substantially flush with the second surface 162 the package body 160. Thus, the second surfaces 122 of the leads 120, second surfaces 132 of the dummy leads 130, and second surfaces 152 of the conductive posts 150, which are each co-planar to each other, are all exposed in and substantially flush with the generally planar second surface 162 of the package body 160. As seen in FIG. 1B, the semiconductor package 100 of the first embodiment includes a total of sixteen leads 120 (segregated into four equal sets of four), four conductive posts 150, and four dummy leads 130. Thus, it follows that the semiconductor die 110 will include a total of sixteen peripheral first bond pads 113, and a total of four central second bond pads 114. However, those of ordinary skill in the art will recognize that the specific numbers of first and second bond pads 113, 114, leads 120 and conductive posts 150 is exemplary only, in that greater or fewer numbers of such elements may be included in the semiconductor package 100 without departing from the spirit and scope of the present invention.

Figure 4A:
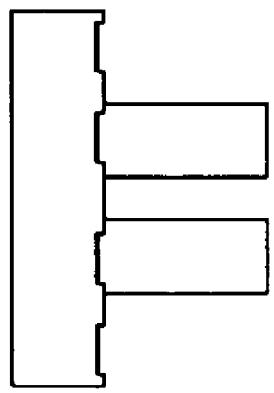
Figure 4A:
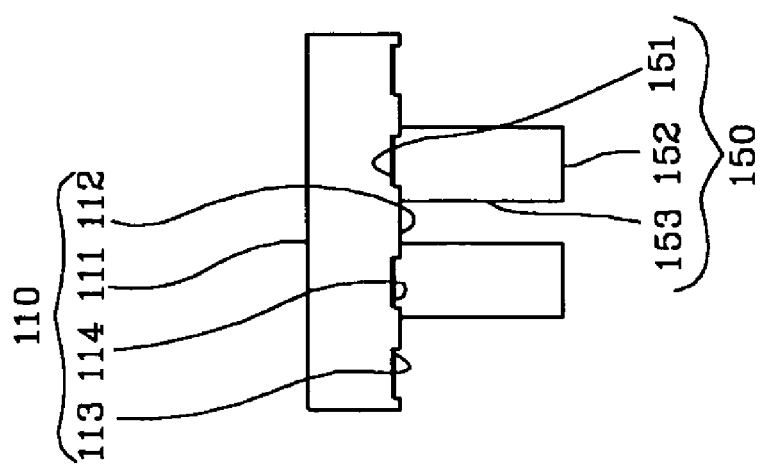
Figure 4B:
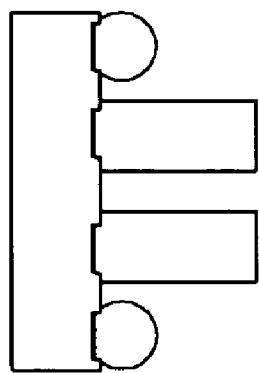
Figure 4B:
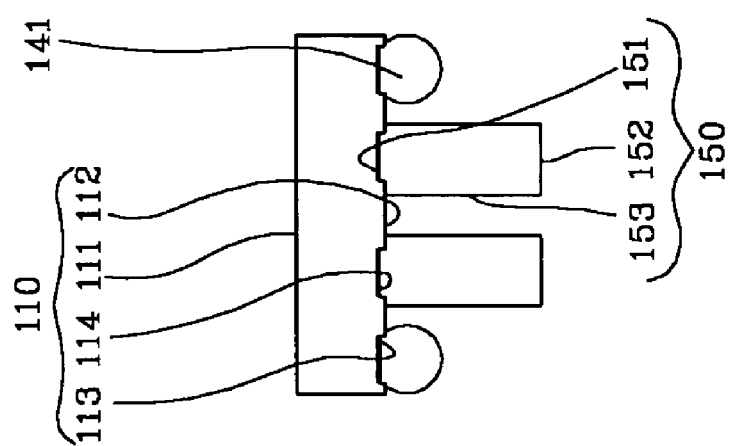

Referring now to FIGS. 4A–4F, there is depicted an exemplary sequence of steps for fabricating the semiconductor package 100 constructed in accordance with the first embodiment of the present invention. In the first step of the preferred method, the first surface 151 of each conductive post 150 is electrically connected a respective one of the central second bond pads 114 of the semiconductor die 110 (FIG. 4A). Thereafter, the conductive bumps 141 are formed on respective ones of the peripheral first bond pads 113 of the semiconductor die 110 (FIG. 4B). The second surfaces 122 of the leads 120 are then affixed or bonded onto a layer of adhesive tape 170 (FIG. 4C). Also bonded to the adhesive tape 170 are the second surfaces 132 of the dummy leads 130. As indicated above, the leads 120 and dummy leads 130 are arranged in a generally quadrangular pattern on the adhesive tape 170, with the dummy leads 130 being disposed at respective ones of the corners of the quadrangular pattern. As is further seen in FIG. 4C, multiple quadrangular patterns of leads 120 and dummy leads 130 may be bonded to a common segment of the adhesive tape 170 to allow for the simultaneous fabrication of multiple semiconductor packages 100.

Figure 4D:
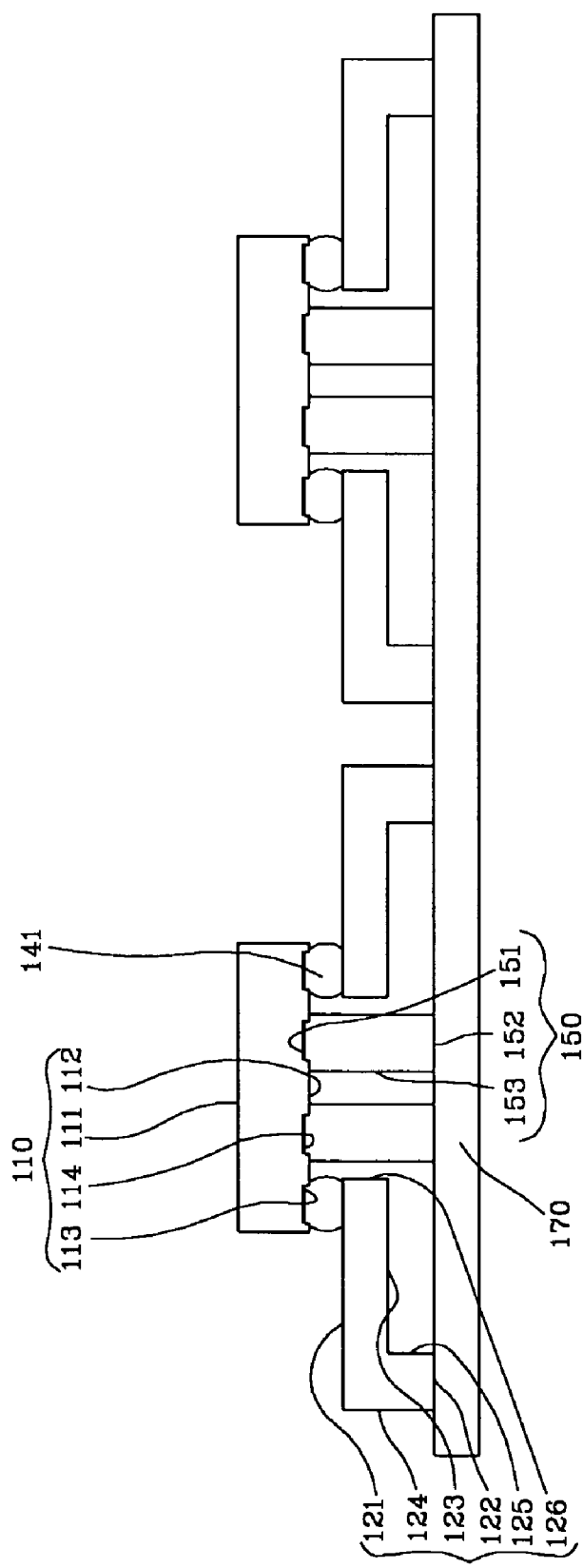

Subsequent to the bonding or affixation of the leads 120 and dummy leads 130 to the adhesive tape 170 in the quadrangular patterns, the conductive bumps 141 connected to the peripheral first bond pads 113 of the semiconductor die 110 are aligned with and abutted against the first surfaces 121 of respective ones of the leads 120 of the corresponding quadrangular pattern thereof (FIG. 4D). The conductive bumps 141 are then reflowed at a high temperature, thus effectively electrically connecting the semiconductor die 110 to the leads 120. When the conductive bumps 141 are placed upon respective ones of the first surfaces 121 of the leads 120, the second surfaces 152 of the conductive posts 150 are bonded to the adhesive tape 170. As is shown in FIG. 4D, a semiconductor die 110 having the conductive bumps 141 and conductive posts 150 electrically connected to the first and second bond pads 113, 114 thereof is interfaced to each quadrangular pattern of the leads 120 and dummy leads 130 bonded to the adhesive tape 170.

Figure 4E:
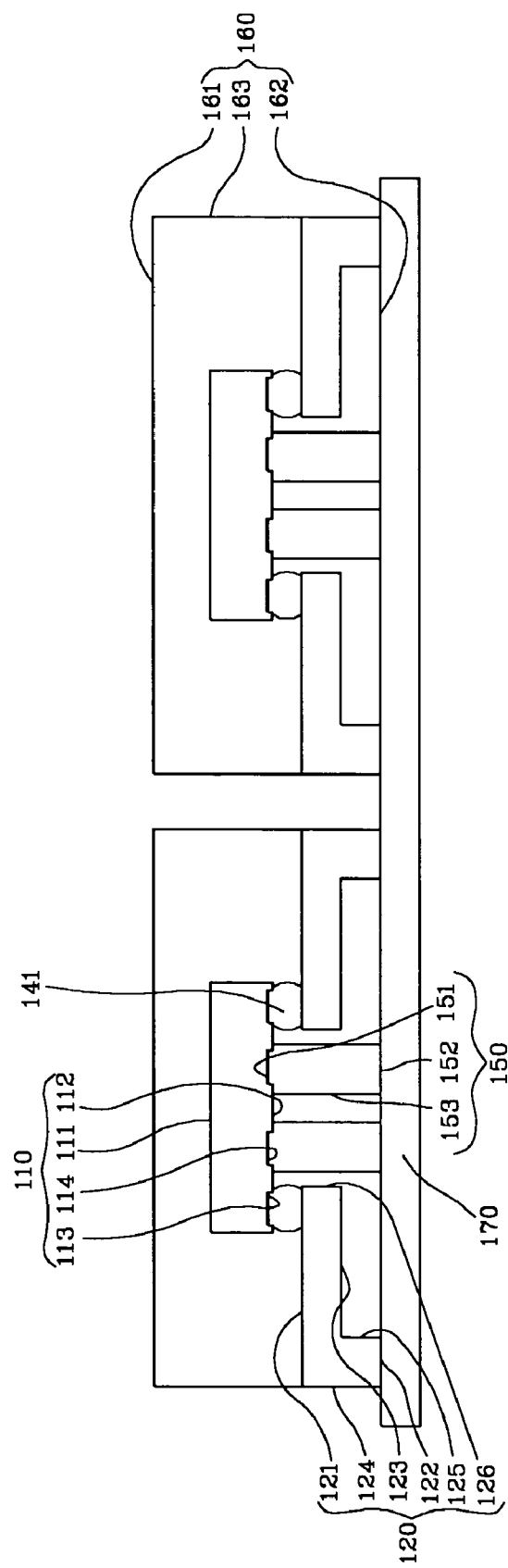

Thereafter, each quadrangular pattern of the leads 120, dummy leads 130 and conductive posts 150, and the semiconductor die 110 and conductive bumps 141 interfaced thereto are encapsulated with an encapsulant material (FIG. 4E). As indicated above, the hardening of this encapsulant material facilitates the formation of the package body 160 of the semiconductor package 100. As seen in FIG. 4E, the second surface 162 of each formed package body 160 rests directly against the adhesive tape 170.

Figure 4F:
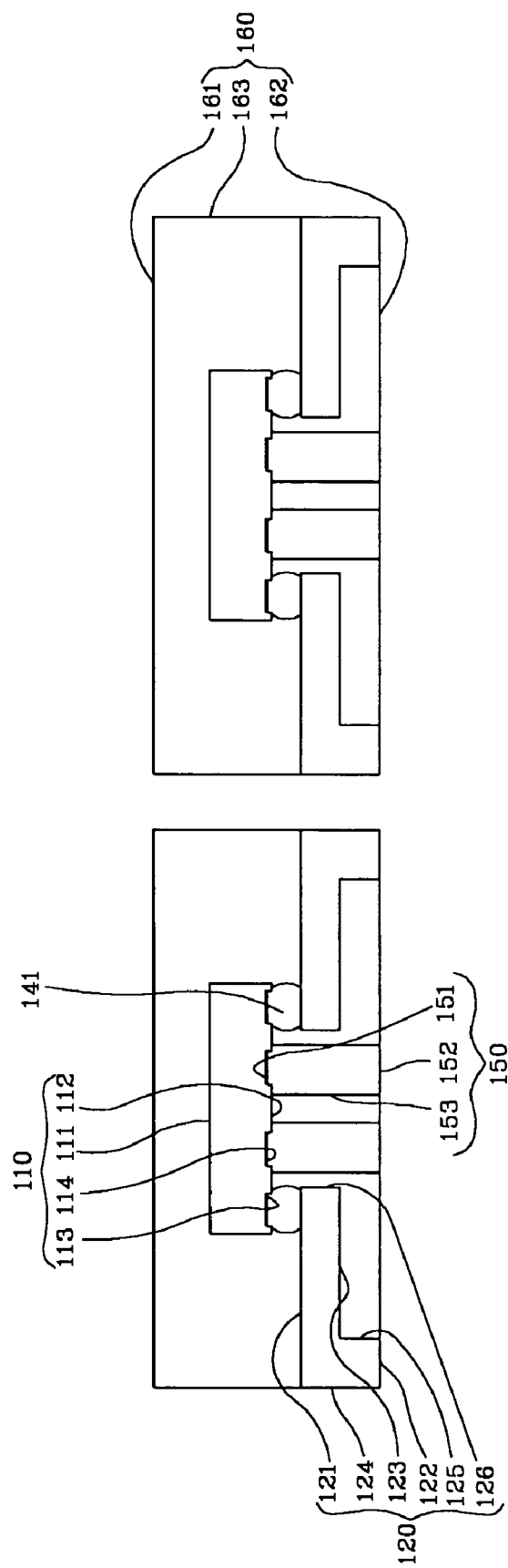

Subsequent to the formation of the package bodies 160, the adhesive tape 170 is removed (FIG. 4F). More particularly, the adhesive tape 170 is removed from the second surface 162 of each package body 160, and the second surfaces 122 of the leads 120, the second surfaces 132 of the dummy leads 130, and the second surfaces 152 of the conductive posts 150. The removal of the adhesive tape 170 completes the formation of the individual semiconductor packages 100. It is contemplated that a plurality of semiconductor packages 100 may be fabricated by forming a single, continuous mold cap which covers each quadrangular pattern of the leads 120 and dummy leads 130, and the corresponding semiconductor dies 110, conductive bumps 141 and conductive posts 150. If a single mold cap is formed, an additional singulation step must be performed either prior or subsequent to the removal of the adhesive tape 170, such singulation step effectively sawing or severing the mold cap in a manner facilitating the formation of the individual package bodies 160 and hence the separate semiconductor packages 100.

Figure 2:
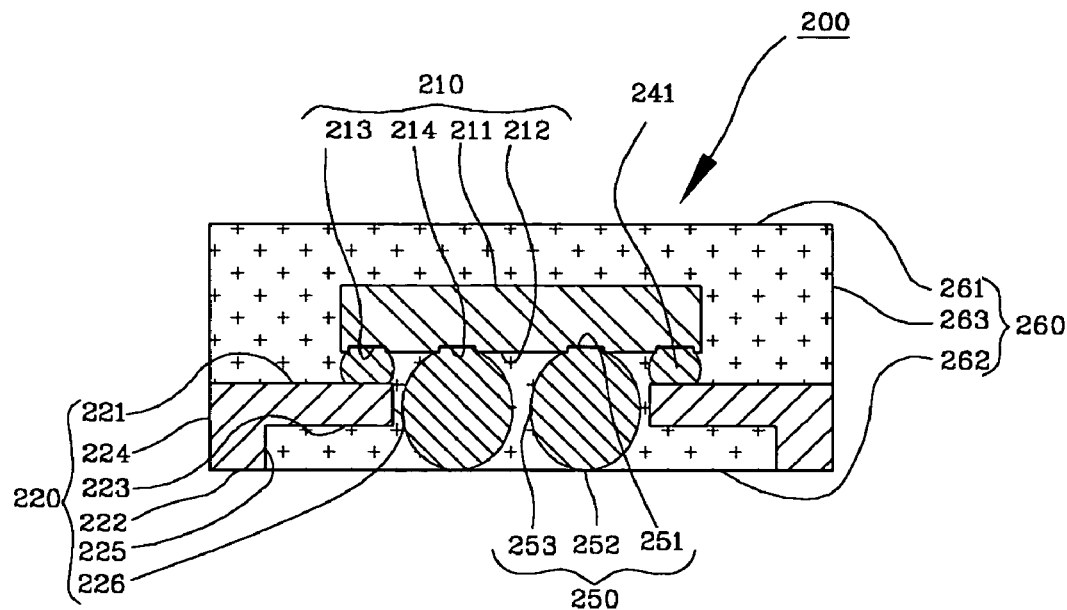
FIG. 2 is a cross-sectional view of a semiconductor package constructed in accordance with a second embodiment of the present invention.

Referring now to FIG. 2, there is shown a semiconductor package 200 constructed in accordance with a second embodiment of the present invention. In FIG. 2, the 200 series reference numerals are used to identify elements corresponding to those identified with the 100 series reference numerals shown in FIGS. 1A–1D. The distinction between the semiconductor packages 100, 200 lies in the configuration of the conductive posts 250 of the semiconductor package 200 in comparison to the conductive posts 150 of the semiconductor package 100. More particularly, in the semiconductor package 200, each conductive post 250 comprises a conductive bump which is larger than the conductive bumps 241 used to electrically connect the peripheral first bond pads 213 of the semiconductor die 210 to the first surfaces 221 of respective ones of the leads 220. Each conductive post 250 is preferably formed by electrically connecting a preformed conductive bump having a larger diameter than the conductive bumps 241 to a respective one of the central second bond pads 214 of the semiconductor die 210. Since the third surface 253 of each conductive post 220 has a predetermined convex curvature, the area of each conductive post 250 adhered to the package body 260 of the semiconductor package 200 is effectively increased. The inclusion of the curved third surfaces 253 with the conductive posts 250 also prevents any easy separation of the conductive posts 250 from the package body 260 of the semiconductor package 200. Each conductive post 250, though defining the curved or arcuate third surface 253, still defines a generally planar second surface 252 which is exposed in and substantially flush with the second surface 262 of the package body 260 and extends in generally co-planar relation to the second surfaces 222 of the leads 220, thus easily being electrically connectable to an external device.

Figure 3:
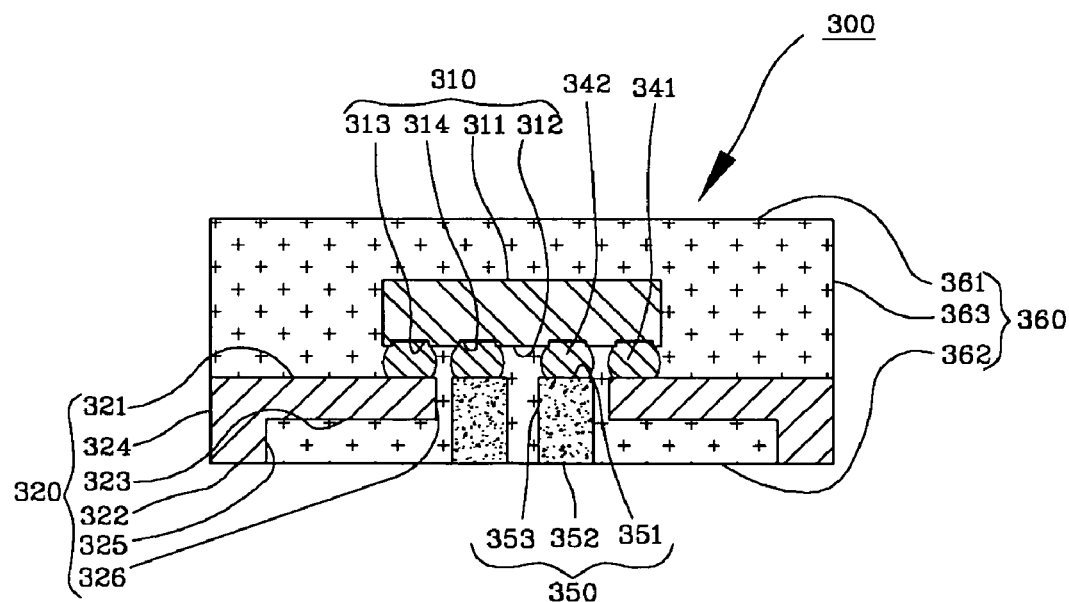
FIG. 3 is a cross-sectional view of a semiconductor package constructed in accordance with a third embodiment of the present invention.

Referring now to FIG. 3, there is shown a semiconductor package 300 constructed in accordance with a third embodiment of the present invention. The 300 series reference numerals shown in FIG. 3 are used to identify elements corresponding to those identified with the 100 series reference numerals shown in FIGS. 1A–1D. The distinction between the semiconductor package 300 of the third embodiment and the semiconductor package 100 of the first embodiment lies in the lengths of the conductive posts 350 included in the semiconductor package 100 in comparison to the conductive posts 150 included in the semiconductor package 100. In this regard, where the conductive posts 150 in the semiconductor package 100 extend upwardly beyond the first surfaces 121 of the leads 120, the first surfaces 351 of the conductive posts 350 in the semiconductor package 300 are generally planar, and extend in generally co-planar relation to the first surfaces 321 of the leads 320. Thus, in addition to the conductive bumps 341 being used in the semiconductor package 300 to electrically connect the peripheral first bond pads 313 of the semiconductor die 310 to the first surfaces 321 of respective ones of the leads 320, second conductive bumps 342 are used to electrically connect the central second bond pads 314 of the semiconductor die 310 to the first surfaces 351 of respective ones of the conductive posts 350. The second conductive bumps 342 are preferably electrically connected to respective ones of the central second bond pads 314 in the same manner described above in relation to the electrical connection of the conductive bumps 141 to the peripheral first bond pads 113 of the semiconductor die 110 (which is also the same technique used to electrically connect the conductive bumps 341 to the peripheral first bond pads 313 of the semiconductor die 310).

Figure 5A:
FIGS. 5A–5F illustrate an exemplary sequence of steps which may be used to facilitate the fabrication of the semiconductor package of the third embodiment shown in FIG. 3.
Figure 5A:
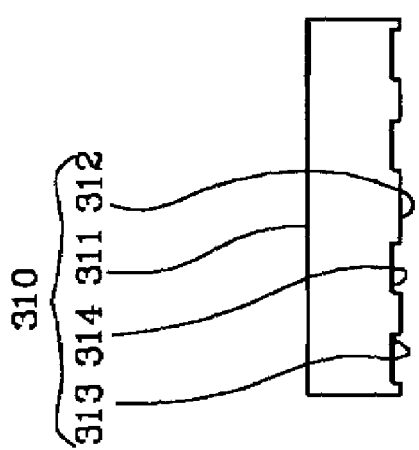
Figure 5B:
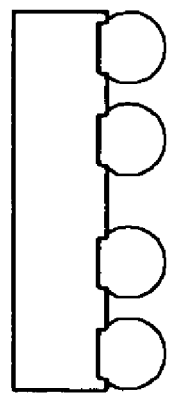
Figure 5B:
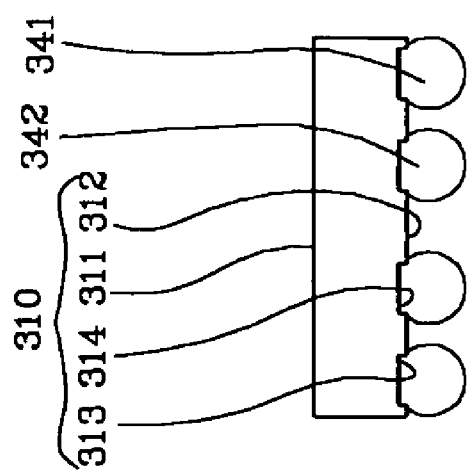

Referring now to FIGS. 5A–5F, there is shown an exemplary sequence of steps which may be used to facilitate the fabrication of the semiconductor package 300 constructed in accordance with the third embodiment of the present invention. In the initial step of the method, the semiconductor die 310 is provided and includes the peripheral first bond pads 313 and the central second bond pads 314 formed on the second surface 312 thereof (FIG. 5A). Thereafter, the first conductive bumps 341 are formed on respective ones of the peripheral first bond pads 313 of the semiconductor die 310, with the second conductive bumps 342 being formed on respective ones of the central second bond pads 314 of the semiconductor die 310 (FIG. 5B). The first and second conductive bumps 341, 342 can be formed by screen-printing or by plating a conductive material in a predetermined thickness on the first and second bond pads 313, 314, respectively. However, those of ordinary skill in the art will recognize that the present invention is not limited to any particular method for forming the first and second conductive bumps 341, 342.

Figure 5C:
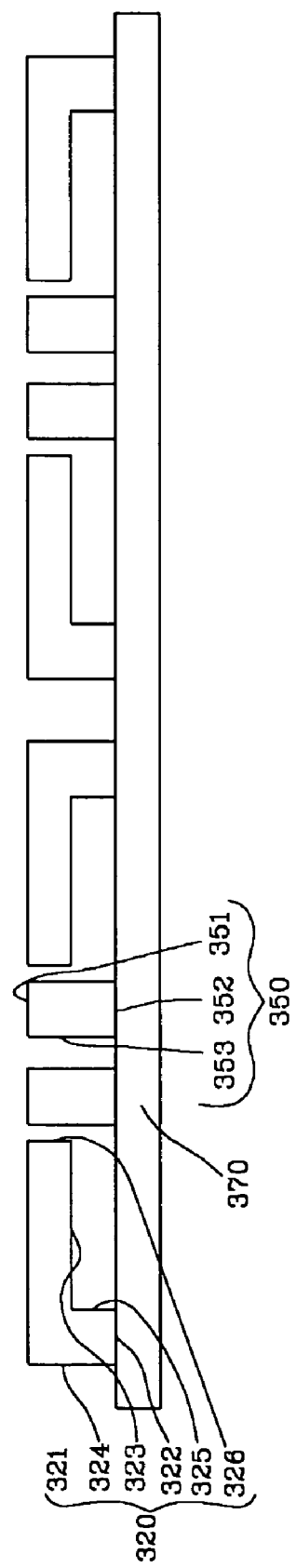

The second surfaces 322 of the leads 320 and the second surfaces 352 of the conductive posts 350 are then affixed or bonded to a layer of adhesive tape 370 (FIG. 5C). Also bonded to the adhesive tape 370 are the second surfaces of the dummy leads. The leads 320 and corresponding dummy leads are arranged in a generally quadrangular pattern on the adhesive tape 370, with the dummy leads being disposed at respective ones of the corners of the quadrangular pattern. As is seen in FIG. 5C, multiple quadrangular patterns of the leads 320 and dummy leads may be bonded to a common segment of the adhesive tape 370 to allow for the simultaneous fabrication of multiple semiconductor packages 100.

Figure 5D:
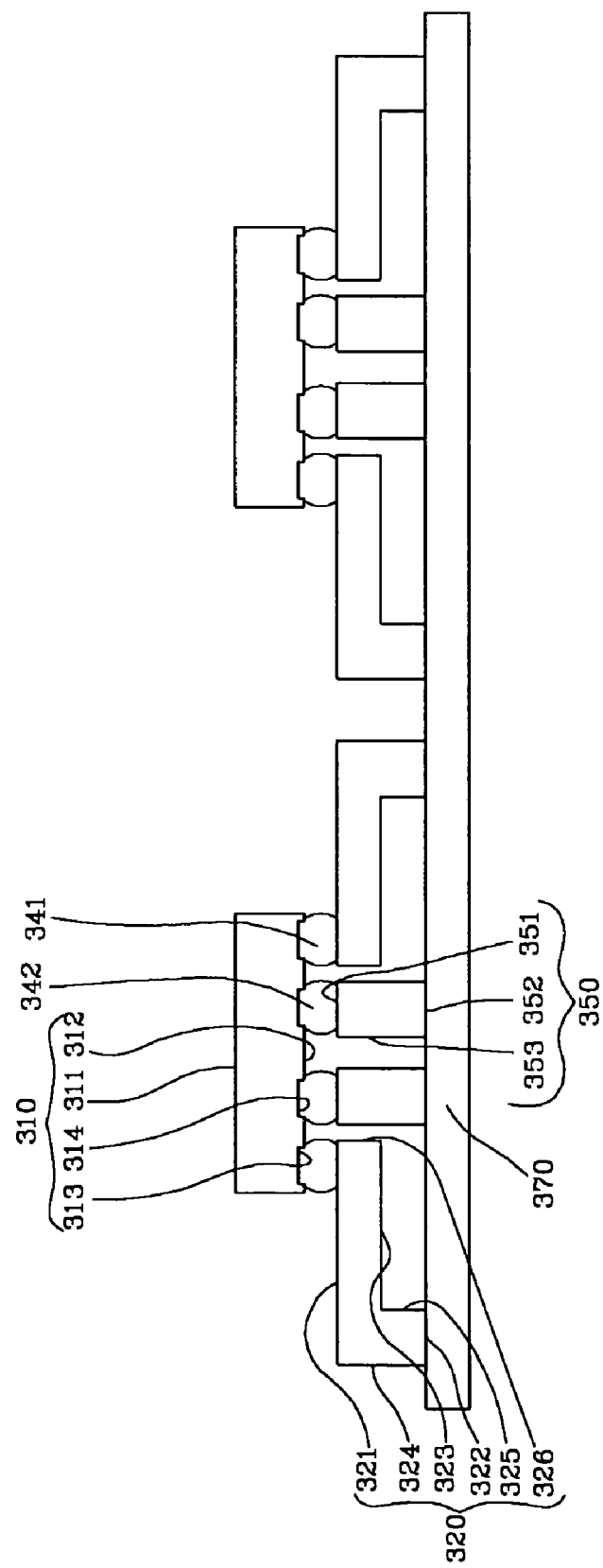

Subsequent to the bonding or affixation of the leads 320, conductive posts 350 and dummy leads to the adhesive tape 370 in prescribed patterns, the first conductive bumps 341 connected to the peripheral first bond pads 313 of the semiconductor die 310 are aligned with and abutted against the first surfaces 321 of respective ones of the leads 320 of the corresponding quadrangular pattern thereof, with the second conductive bumps 342 connected to the central second bond pads 314 being aligned with and abutted against the first surfaces 351 of respective ones of the corresponding conductive posts 350 (FIG. 5D). The conductive bumps 341, 342 are then reflowed at a high temperature, thus effectively electrically connecting the semiconductor die 310 to the leads 320 and conductive posts 350. As is shown in FIG. 5D, a semiconductor die 310 having the conductive bumps 341, 342 electrically connected to the first and second bond pads 313, 314 thereof is interfaced to each quadrangular pattern of the leads 320 and conductive posts 350 bonded to the adhesive tape 370.

Figure 5E:
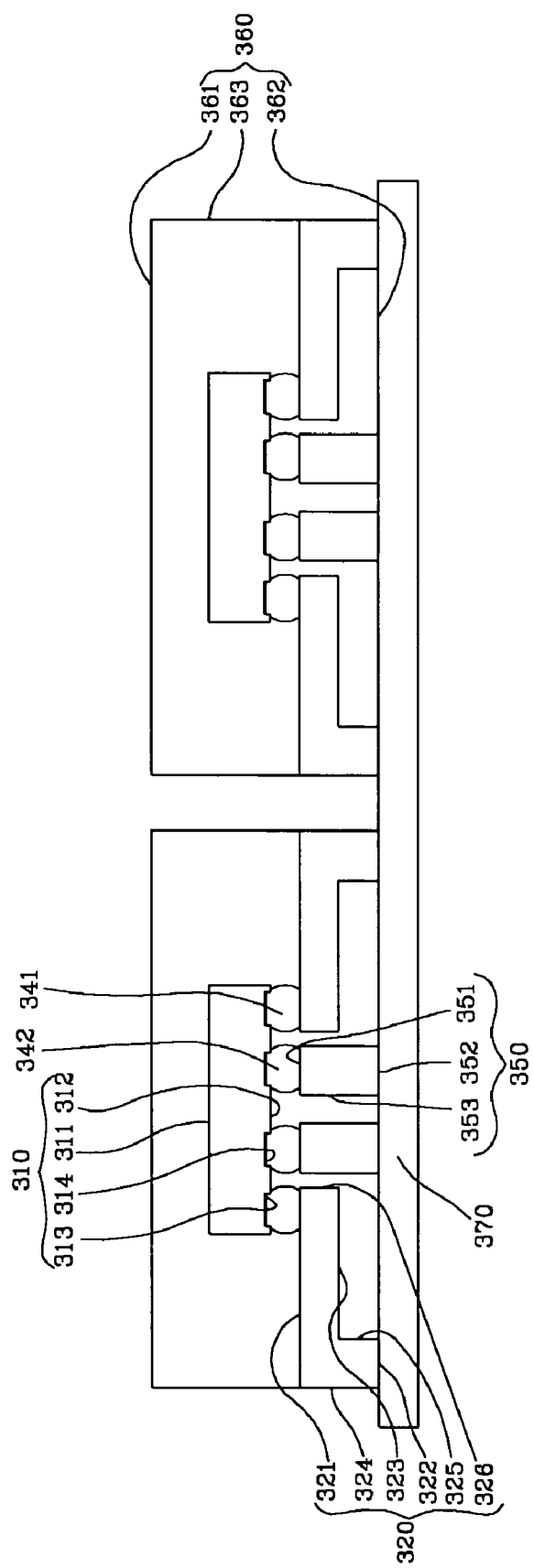

Thereafter, each quadrangular pattern of the leads 320, dummy leads and conductive posts 350, and the semiconductor die 310 and conductive bumps 341, 342 interfaced thereto are encapsulated with an encapsulant material (FIG. 5E). As indicated above, the hardening of this encapsulant material facilitates the formation of the package body 360 of the semiconductor package 300. As seen in FIG. 5E, the second surface 362 of each formed package body 360 rests directly against the adhesive tape 370.

Figure 5F:
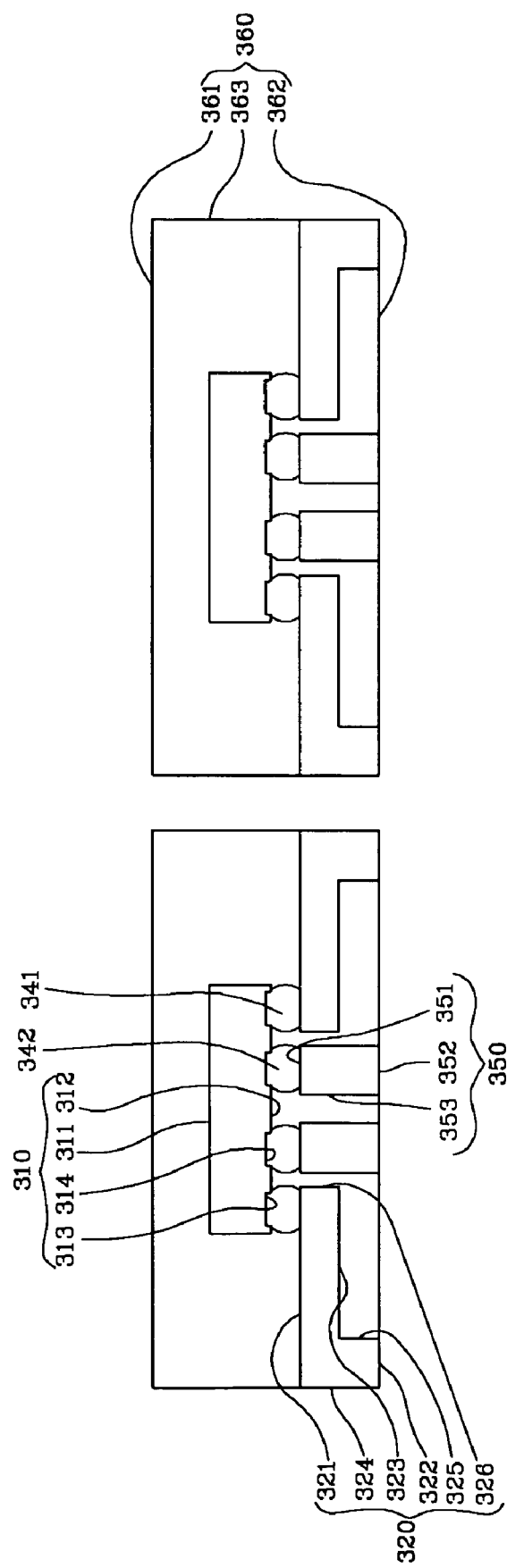

Subsequent to the formation of the package bodies 360, the adhesive tape 370 is removed (FIG. 5F). More particularly, the adhesive tape 370 is removed from the second surface 362 of each package body 360, and the second surfaces 322 of the leads 320, the second surfaces of the dummy leads, and the second surfaces 352 of the conductive posts 350. The removal of the adhesive tape 370 completes the formation of the individual semiconductor packages 300. It is contemplated that a plurality of semiconductor packages 300 may be fabricated by forming a single, continuous mold cap which covers each quadrangular pattern of the leads 320 and dummy leads, and the corresponding semiconductor dies 310, conductive bumps 341, 342, and conductive posts 350. If a single mold cap is formed, an additional singulation step must be performed either prior or subsequent to the removal of the adhesive tape the formation of the individual package bodies 360 and hence the separate semiconductor packages 300.

Those of ordinary skill in the art will recognize that each of the above-described embodiments of the present invention may be modified in a manner wherein no dummy leads are included in the semiconductor package.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package, comprising:
    a semiconductor die having opposed first and second surfaces and at least first and second bond pads disposed on the second surface thereof;
    at least one lead having opposed first and second surfaces, the first surface of the lead being electrically connected to the first bond pad;
    at least one conductive post having opposed first and second surfaces, the distance between the first and second surfaces of the conductive post being greater than the distance between the first and second surfaces of the lead, the first surface of the conductive post being electrically connected to the second bond pad; and
    a package body at least partially encapsulating the semiconductor die, the lead, and the conductive post such that the second surface of the lead and the second surface of the conductive post are exposed in a common exterior surface of the package body.

2. The semiconductor package of claim 1 wherein:
    the exterior surface of the package body is generally planar; and
    the second surface of the lead and the second surface of the conductive post are each generally planar and substantially flush with the exterior surface.

3. The semiconductor package of claim 1 wherein:
    the semiconductor die has a plurality of first bond pads and a plurality of second bond pads disposed on the second surface thereof;
    the first bond pads are electrically connected to respective ones of a plurality of leads; and
    the second bond pads are electrically connected to respective ones of a plurality of conductive posts.

4. The semiconductor package of claim 3 wherein:
    the first bond pads at least partially overlap the first surfaces of respective ones of the leads; and
    the second bond pads at least partially overlap the first surfaces of respective ones of the conductive posts.

5. The semiconductor package of claim 4 wherein:
    the leads are arranged in a generally quadrangular pattern;
    the conductive posts are circumvented by the leads;
    the first bond pads are disposed on a peripheral portion of the second surface of the semiconductor die in a generally quadrangular pattern in alignment with the first surfaces of respective ones of the leads; and
    the second bond pads are circumvented by the leads and disposed in a central portion of the second surface of the semiconductor die in alignment with the first surfaces of respective ones of the conductive posts.

6. The semiconductor package of claim 5 wherein:
the first bond pads are electrically connected to the first surfaces of respective ones of the leads by first conductive bumps; and
the second bond pads are electrically connected to the first surfaces of respective ones of the conductive posts by second conductive bumps.

7. The semiconductor package of claim 6 wherein the first surfaces of the leads and the first surfaces of the conductive posts extend in generally co-planar relation to each other.

8. The semiconductor package of claim 5 wherein:
each of the first bond pads is electrically connected to the first surface of a respective one of the leads by a conductive bump; and
the first surface of each of the conductive posts is directly connected to a respective one of the second bond pads.

9. The semiconductor package of claim 8 wherein the first surfaces of the conductive posts and the first surfaces of the leads extend along respective ones of a spaced, substantially parallel pair of planes.

10. The semiconductor package of claim 5 further comprising a plurality of dummy leads disposed at respective ones of four corner regions defined by the quadrangular pattern of leads.

11. The semiconductor package of claim 10 wherein:
the exterior surface of the package body is generally planar;
each of the dummy leads defines a first surface and an opposed, generally planar second surface; and
the second surfaces of the leads, the second surfaces of the conductive posts, and the second surfaces of the dummy leads are generally planar and substantially flush with the exterior surface of the package body.

12. The semiconductor package of claim 11 wherein each of the dummy leads further includes a third surface which is perpendicularly recessed relative to the second surface and is covered by the package body.

13. The semiconductor package of claim 1 wherein the lead further includes a third surface which is perpendicularly recessed relative to the second surface and is covered by the package body.

14. The semiconductor package of claim 1 wherein the conductive post includes a third surface which extends perpendicularly between the first and second surfaces thereof.

15. The semiconductor package of claim 1 wherein the conductive post includes an arcuate, convex third surface which extends between the first and second surfaces thereof.

16. A semiconductor package comprising:
semiconductor die having opposed first and second surfaces, a plurality of first bond pads disposed on a peripheral portion of the second surface, and a plurality of second bond pads disposed on a central portion of the second surface;
a plurality of leads having opposed first and second surfaces, the leads being arranged in a generally quadrangular pattern, with a portion of the first surface of each of the leads being aligned with and electrically connected to a respective one of the first bond pads;
a plurality of conductive posts having opposed first and second surfaces and circumvented by the leads, the distance between the first and second surfaces of each of the conductive posts being greater than the distance between the first and second surfaces of each of the leads, the first surface of each of the conductive posts being aligned with and electrically connected to a respective one of the second bond pads; and
a package body at least partially encapsulating the semiconductor die, the leads, and the conductive posts such that the second surfaces of the leads and the second surface of each of the conductive posts are exposed in a common exterior surface of the package body.

17. The semiconductor package of claim 16 wherein:
each of the first bond pads is electrically connected to the first surface of a respective one of the leads by a first conductive bump; and
each of the second bond pads is electrically connected to the first surface of a respective one of the conductive posts by a second conductive bump.

18. The semiconductor package of claim 17 wherein the first surfaces of the leads and the first surfaces of the conductive posts extend in generally co-planar relation to each other.

19. The semiconductor package of claim 16 wherein:
each of the first bond pads is electrically connected to the first surface of a respective one of the leads by a conductive bump; and
the first surface of each of the conductive posts is directly connected to a respective one of the second bond pads.

20. The semiconductor package of claim 19 wherein the first surfaces of the conductive posts and the first surfaces of the leads extend along respective ones of a spaced, substantially parallel pair of planes.

* * * * *